(12) United States Patent
Pehlke et al.

(10) Patent No.: US 10,374,555 B2
(45) Date of Patent: Aug. 6, 2019

(54) RADIO-FREQUENCY AMPLIFIER HAVING ACTIVE GAIN BYPASS CIRCUIT

(71) Applicant: SKYWORKS SOLUTIONS, INC., Woburn, MA (US)

(72) Inventors: David Richard Pehlke, Westlake Village, CA (US); John Chi-Shuen Leung, Foothill Ranch, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/703,956

(22) Filed: Sep. 13, 2017

(65) Prior Publication Data

US 2018/0076774 A1 Mar. 15, 2018

Related U.S. Application Data

(60) Provisional application No. 62/394,746, filed on Sep. 14, 2016.

(51) Int. Cl.
| | |
|---|---|
| *H03F 1/22* | (2006.01) |
| *H03F 1/56* | (2006.01) |
| *H03F 3/195* | (2006.01) |
| *H03F 1/12* | (2006.01) |
| *H03F 1/02* | (2006.01) |
| *H03F 3/21* | (2006.01) |

(Continued)

(52) U.S. Cl.
CPC .......... *H03F 1/223* (2013.01); *H03F 1/0277* (2013.01); *H03F 1/12* (2013.01); *H03F 1/56* (2013.01); *H03F 3/195* (2013.01); *H03F 3/211* (2013.01); *H03F 3/72* (2013.01); *H03F 2200/222* (2013.01); *H03F 2200/249* (2013.01); *H03F 2200/294* (2013.01); *H03F 2200/451* (2013.01); *H03F 2203/21103* (2013.01); *H03F 2203/21109* (2013.01); *H03F 2203/21112* (2013.01); *H03F 2203/7215* (2013.01); *H03F 2203/7236* (2013.01); *H04B 7/04* (2013.01); *H04B 7/08* (2013.01)

(58) Field of Classification Search
CPC ....................................................... H03F 1/22
USPC ................................................. 330/311, 310
See application file for complete search history.

(56) References Cited

U.S. PATENT DOCUMENTS

| 4,586,004 A | * | 4/1986 | Valdez | .................... H03F 1/223 326/110 |
| 6,075,414 A | * | 6/2000 | Nagaoka | ................ H03G 1/007 330/145 |

(Continued)

*Primary Examiner* — Henry Choe
(74) *Attorney, Agent, or Firm* — Chang & Hale LLP

(57) ABSTRACT

Radio-frequency (RF) amplifier having active gain bypass circuit. In some embodiments, an amplifier can include a first amplification path implemented to amplify a signal, and having a cascode arrangement of a first input transistor and a cascode transistor to provide a first gain for the signal when in a first mode. The amplifier can further include a second amplification path implemented to provide a second gain for the signal while bypassing at least a portion of the first amplification path when in a second mode. The second amplification path can include a cascode arrangement of a second input transistor and the cascode transistor shared with the first amplification path. The amplifier can further include a switch configured to allow routing of the signal through the first amplification path in the first mode or the second amplification path in the second mode.

19 Claims, 15 Drawing Sheets

(51) Int. Cl.
*H03F 3/72* (2006.01)
*H04B 7/08* (2006.01)
*H04B 7/04* (2017.01)

(56) References Cited

U.S. PATENT DOCUMENTS

| | | | | |
|---|---|---|---|---|
| 6,489,843 B1* | 12/2002 | Nishijima | ............... | H03F 3/602 |
| | | | | 330/128 |
| 6,987,422 B2* | 1/2006 | Vice | ...................... | H03F 1/0277 |
| | | | | 330/285 |
| 7,205,846 B1* | 4/2007 | Ding | ..................... | H03F 3/189 |
| | | | | 330/295 |
| 7,352,247 B2* | 4/2008 | Oh | ......................... | H03F 1/223 |
| | | | | 330/310 |
| 8,294,523 B2* | 10/2012 | Thomas | .................... | H03F 1/22 |
| | | | | 330/136 |
| 8,466,749 B2* | 6/2013 | Ahn | .................... | H03G 1/0029 |
| | | | | 330/311 |
| 9,973,149 B2* | 5/2018 | Ayranci | ............... | H03F 1/0277 |
| 2005/0231290 A1* | 10/2005 | Hung | ...................... | H03F 1/223 |
| | | | | 330/311 |
| 2008/0079499 A1* | 4/2008 | Tsai | ....................... | H03F 1/223 |
| | | | | 330/311 |
| 2017/0041029 A1* | 2/2017 | Whittaker | ............... | H04B 1/04 |

\* cited by examiner

RADIO-FREQUENCY AMPLIFIER HAVING ACTIVE GAIN BYPASS CIRCUIT

CROSS-REFERENCE TO RELATED APPLICATION(S)

This application claims priority to U.S. Provisional Application No. 62/394,746 filed Sep. 14, 2016, entitled LOW-NOISE AMPLIFIER HAVING ACTIVE GAIN BYPASS CIRCUIT, the disclosure of which is hereby expressly incorporated by reference herein in its entirety.

BACKGROUND

Field

The present disclosure relates to amplifiers for radio-frequency (RF) applications.

Description of the Related Art

In radio-frequency (RF) applications, an amplifier is utilized to amplify a signal. For example, a power amplifier is typically utilized to provide power amplification for a signal to be transmitted. In another example, a low-noise amplifier (LNA) is typically utilized to provide amplification for a relatively weak signal received through an antenna.

SUMMARY

According to a number of implementations, the present disclosure relates to a radio-frequency (RF) amplifier that includes a first amplification path implemented to amplify a signal, and including a cascode arrangement of a first input transistor and a cascode transistor to provide a first gain for the signal when in a first mode. The RF amplifier further includes a second amplification path implemented to provide a second gain for the signal while bypassing at least a portion of the first amplification path when in a second mode. The second amplification path includes a cascode arrangement of a second input transistor and the cascode transistor shared with the first amplification path. The RF amplifier further includes a switch configured to allow routing of the signal through the first amplification path in the first mode or the second amplification path in the second mode.

In some embodiments, the first gain can be greater than the second gain. The switch can be implemented to be a part of the second amplification path.

In some embodiments, the second amplification path can further include an attenuator in series with the switch, with the attenuator being configured to facilitate the second gain of the second mode. The attenuator can be configured to provide variable attenuation.

In some embodiments, the second amplification path can further include a matching network in series with the switch. The matching network can be configured to provide matching of an input impedance for the second amplification path that is approximately the same as an input impedance for the first amplification path. The matching network can be configured to provide a phase shift for the second amplification path that is approximately the same as a phase shift for the first amplification path.

In some embodiments, the first amplification path and the second amplification path can share a common input node. In some embodiments, the first amplification path and the second amplification path can have separate input nodes.

In some embodiments, the first input transistor can be ON, the second input transistor can be OFF, and the switch of the second amplification path can be OFF, when in the first mode. The first input transistor can be OFF, the second input transistor can be ON, and the switch of the second amplification path can be ON, when in the second mode.

In some embodiments, each of the first amplification path and the second amplification path can further include an inter-stage switch between the respective input transistor and the cascode transistor. The first input transistor can be ON, the second input transistor can be OFF, the switch of the second amplification path can be OFF, the inter-stage switch of the first amplification path can be ON, and the inter-stage switch of the second amplification path can be OFF, when in the first mode. The first input transistor can be OFF, the second input transistor can be ON, the switch of the second amplification path can be ON, the inter-stage switch of the first amplification path can be OFF, and the inter-stage switch of the second amplification path can be ON, when in the second mode.

In some embodiments, each of the first input transistor, the second input transistor, and the cascode transistor can be implemented as a field-effect transistor having a gate, a source, and a drain. The switch of the second amplification path can be implemented as a field-effect transistor having a gate, a source, and a drain. Each of the first input transistor, the second input transistor, the cascode transistor, and the switch of the second amplification path can implemented as, for example, a silicon-on-insulator device.

In some embodiments, the gate of each of the first input transistor and the second input transistor can be configured to receive the signal, the drain of each of the first input transistor and the second input transistor can be coupled to the source of the cascode transistor, and the source of each of the first input transistor and the second input transistor can be inductively coupled to ground. The drain of the cascode transistor can be coupled to an output node of the radio-frequency amplifier and configured to receive a supply voltage.

In some embodiments, the source of the first input transistor and the source of the second input transistor can be inductively coupled to ground through a common degeneration inductance. The first input transistor and the second input transistor can be configured substantially the same.

In some embodiments, the source of the first input transistor and the source of the second input transistor can be inductively coupled to ground through separate degeneration inductances. The first input transistor and the second input transistor can be configured differently from each other.

In some embodiments, the radio-frequency amplifier can be a low-noise amplifier. The switch of the second amplification path can be configured to provide a reduced level of parasitic capacitance when in an OFF state in the first mode. The first amplification path can be configured to provide the first gain for a weak received signal, such that the amplified signal includes a desired combination of the first gain and a low noise figure. The second amplification path can be configured to provide the second gain for a strong received signal, such that the amplified signal includes a desired combination of the second gain and a high linearity level.

In some teachings, the present disclosure relates to a method for amplifying a signal. The method includes providing a first amplification path implemented to amplify a signal and including a cascode arrangement of a first input transistor and a cascode transistor to provide a first gain for the signal when in a first mode. The method further includes providing a second amplification path implemented to provide a second gain for the signal when in a second mode, with the second amplification path including a cascode arrangement of a second input transistor and the cascode transistor shared with the first amplification path. The method further includes performing a switching operation to route the signal through the first amplification path in the first mode or the second amplification path in the second mode.

In some embodiments, the first gain can be greater than the second gain. In some embodiments, the method can further include attenuating the signal when the signal is routed through the second amplification path in the second mode. In some embodiments, the method can further include matching an input impedance of the second amplification path that is approximately the same as an input impedance for the first amplification path. In some embodiments, the method can further include providing a phase shift for the second amplification path that is approximately the same as a phase shift for the first amplification path.

In a number of implementations, the present disclosure relates to a semiconductor die having a radio-frequency circuit. The semiconductor die includes a substrate and an amplifier implemented on the substrate. The amplifier includes a first amplification path implemented to amplify a signal and having a cascode arrangement of a first input transistor and a cascode transistor to provide a first gain for the signal when in a first mode. The amplifier further includes a second amplification path implemented to provide a second gain for the signal while bypassing at least a portion of the first amplification path when in a second mode, with the second amplification path including a cascode arrangement of a second input transistor and the cascode transistor shared with the first amplification path. The amplifier further includes a switch configured to allow routing of the signal through the first amplification path in the first mode or the second amplification path in the second mode.

In some embodiments, the substrate can include a silicon-on-insulator substrate. In some embodiments, the amplifier can be a low-noise amplifier.

In some implementations, the present disclosure relates to a radio-frequency module that includes a packaging substrate configured to receive a plurality of components, and an amplifier implemented on the packaging substrate. The amplifier includes a first amplification path implemented to amplify a signal and having a cascode arrangement of a first input transistor and a cascode transistor to provide a first gain for the signal when in a first mode. The amplifier further includes a second amplification path implemented to provide a second gain for the signal while bypassing at least a portion of the first amplification path when in a second mode, with the second amplification path including a cascode arrangement of a second input transistor and the cascode transistor shared with the first amplification path. The amplifier further includes a switch configured to allow routing of the signal through the first amplification path in the first mode or the second amplification path in the second mode.

In some embodiments, the amplifier can be implemented on a semiconductor die that is mounted on the packaging substrate. In some embodiments, the amplifier can be a low-noise amplifier. In some embodiments, the radio-frequency module can be a receive module.

In accordance with some implementations, the present disclosure relates to a wireless device that includes an antenna configured to at least receive a signal, and an amplifier in communication with the antenna and including a first amplification path implemented to amplify the signal with a cascode arrangement of a first input transistor and a cascode transistor to provide a first gain for the signal when in a first mode. The amplifier further includes a second amplification path implemented to provide a second gain for the signal while bypassing at least a portion of the first amplification path when in a second mode, with the second amplification path including a cascode arrangement of a second input transistor and the cascode transistor shared with the first amplification path. The amplifier further includes a switch configured to allow routing of the signal through the first amplification path in the first mode or the second amplification path in the second mode. The wireless device further includes a transceiver configured to process the amplified signal generated by the amplifier.

In some embodiments, the wireless device can be a cellular phone configured to include different gains in receive operations.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In many wireless applications, receivers typically require large dynamic ranges, and such a requirement can be achieved through multiple gain states with varying levels of gain, noise figure, and linearity. For example, a smaller signal may require a gain state with a higher gain, a lower noise figure, and a reasonable but not extremely high linearity performance. A higher signal level may require a lower gain, a significantly relaxed noise figure, and a high linearity to amplify the signal with good fidelity. These gain states may also have some requirement to maintain a similar phase shift as changes are made from one gain state to another.

It is noted that in wireless designs, a high gain state with a low noise figure typically cannot tolerate insertion loss placed in series with a low-noise amplifier (LNA). It is also noted that a low gain state with a relaxed noise figure typically requires a series switch and potentially an attenuator to achieve high linearity levels. It is further noted that an LNA can be entirely bypassed; however, phase shift can be difficult to maintain as one switches from an active gain mode to a full passive bypass mode.

Figure 1:
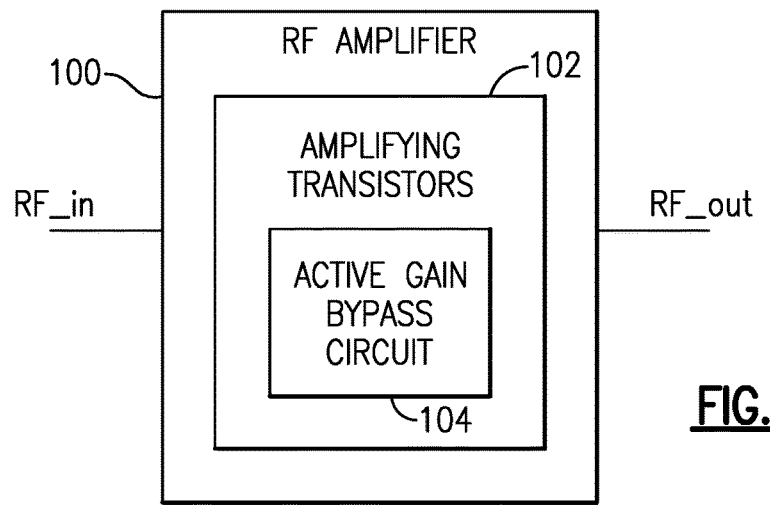
FIG. 1 depicts a radio-frequency amplifier having a plurality of amplifying transistors and an active gain bypass circuit.

Described herein are architectures, circuits, devices and methods related to, among others, a radio-frequency (RF) amplifier having an active gain bypass circuit. FIG. 1 depicts an RF amplifier 100 having a plurality of amplifying transistors 102 and an active gain bypass circuit 104. Such an RF amplifier can receive an input RF signal (RF_in) and amplify such a signal to generate an output RF signal (RF_out). For the purpose of description, various examples related to such an RF amplifier are described in the context of a low-noise amplifier (LNA). However, it will be understood that one or more features of the present disclosure can also be implemented for other types of RF amplifiers, including power amplifiers (PAs).

Figure 2:
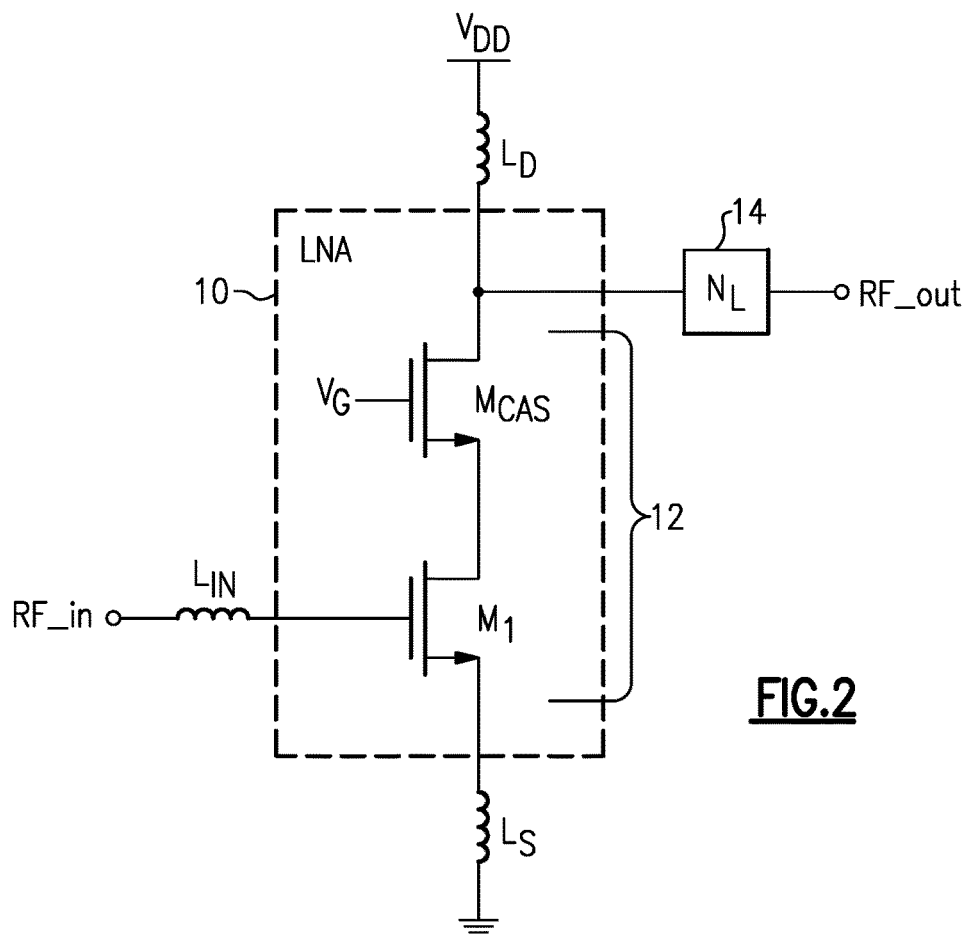
FIG. 2 shows an example of a low-noise amplifier (LNA) implemented in a cascode configuration.

FIG. 2 shows an example of an LNA 10 implemented in a cascode configuration. Such an LNA can include first and second transistors (collectively indicated as 12) implemented in a cascode configuration. For example, the first transistor $M_1$ can be configured to operate as a common source device (also referred to as an RF stage), and the second transistor $M_{CAS}$ can be configured to operate as a common gate device (also referred to as a cascode stage). More particularly, an input RF signal (RF_in) is shown to be provided to a gate of the first transistor $M_1$ through an input inductance $L_{IN}$, and the amplified signal is shown to be output through its drain. The source of the first transistor $M_1$ is shown to be coupled to ground, typically through an inductance indicated as $L_S$. The amplified signal from the drain of the first transistor $M_1$ is shown to be provided to a source of the second transistor $M_{CAS}$ for further amplification, and such further amplified signal is shown to be output through the drain of the second transistor $M_{CAS}$. The gate of the second transistor $M_{CAS}$ can be provided with an appropriate gate voltage $V_G$ for operation. In the example of FIG. 2, the LNA 10 is shown to be provided with a supply voltage $V_{DD}$ at the drain of $M_{CAS}$ through an inductance $L_D$. In the example of FIG. 2, the amplified signal from the LNA 10 can be provided to an output node (RF_out) through an output matching network $N_L$ (14).

Figure 3:
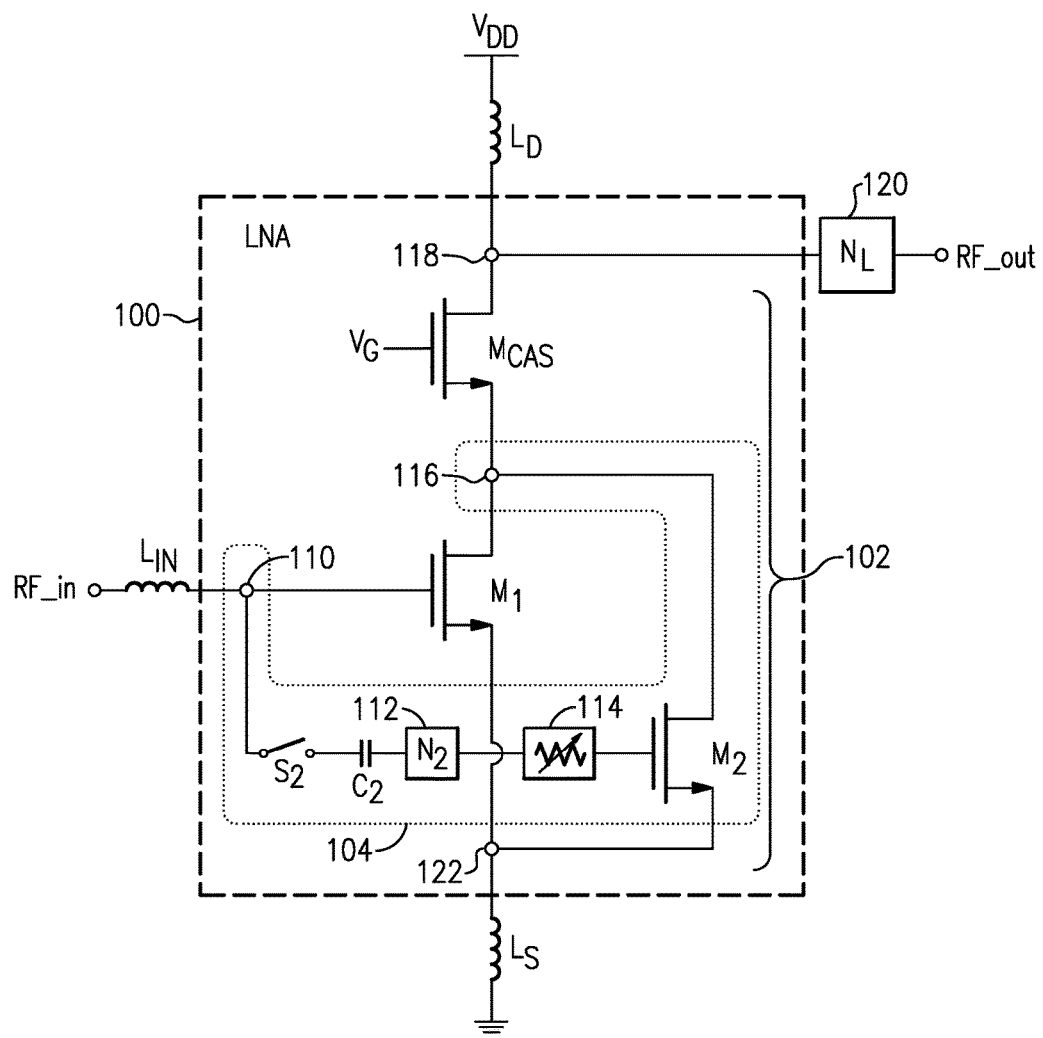
FIG. 3 shows that in some embodiments, an LNA can include a second amplification path configured to selectively divert a signal away from a primary input transistor of a cascode arrangement.

In some embodiments, an LNA can include a second amplification path configured to selectively divert a signal away from a primary input transistor (e.g., the first transistor $M_1$ in FIG. 2) of a cascode arrangement. FIG. 3 shows an example of such a second amplification path depicted as 104. As described herein, such a second amplification path can be configured to function as an active gain bypass circuit 104 of FIG. 1. In the example of FIG. 3, the cascode arrangement of $M_1$ and $M_{CAS}$ can be similar to the example of FIG. 2.

FIG. 3 shows that in some embodiments, the second amplification path (also referred to herein as active gain bypass circuit) 104 can include a low parasitic shunt switch $S_2$ that can be engaged to divert a signal from an input node 110 of $M_1$. The second amplification path 104 can include an attenuator 114 (e.g., a tunable attenuator) in series with the switch $S_2$, with the series combination of $S_2$ and the attenuator 114 being between the input node 110 of $M_1$ and a gate of a second input transistor $M_2$.

In the example of FIG. 3, the source of the second input transistor $M_2$ is shown to be coupled to ground through an inductance indicated as $L_S$. In some embodiments, the source of the first input transistor $M_1$ and the source of the second input transistor $M_2$ can share the inductance $L_S$ as a common degeneration inductance. For example, a common node 122 is shown to be coupled to the source of the first input transistor $M_1$ and the source of the second input transistor $M_2$, and such a common node is shown to be coupled to ground through the inductance $L_S$.

In the example of FIG. 3, the amplified signal from the drain of the second input transistor $M_2$ is shown to be provided to a source of the cascode transistor $M_{CAS}$ for further amplification, and such further amplified signal is shown to be output through the drain of the cascode transistor $M_{CAS}$. In some embodiments, a common node 116 can be coupled to the drain of the first input transistor $M_1$ and the drain of the second input transistor $M_2$, and such a common node can be coupled to the source of the cascode transistor $M_{CAS}$.

In some embodiments, the second amplification path 104 can further include a capacitance $C_2$ and a matching network $N_2$ (112) in series with the switch $S_2$. For example, the capacitance $C_2$ and the matching network $N_2$ can be implemented in series between the switch $S_2$ and the attenuator 114. In some embodiments, the matching network $N_2$ can be configured to provide matching of an input impedance approximately the same as the input impedance for a first-gain operation involving the first amplification path involving the cascode arrangement of $M_1$ and $M_{CAS}$. The matching network $N_2$ can also be configured to provide a phase shift that is approximately the same as the phase shift associated with the first amplification path.

In some embodiments, the switch $S_2$ can be configured to provide a low parasitic effect (e.g., low parasitic capacitance). Thus, when $S_2$ is OFF during operation of the first amplification path (through $M_1$), $S_2$ provides a minimal or reduced parasitic impact to such a first amplification path. Accordingly, when the LNA 100 is in the first gain mode ($G_0$ mode), an optimum or desired combination of gain and noise figure (NF) can be achieved. It is noted that in the first amplification path involving the cascode arrangement of $M_1$ and $M_{CAS}$, the foregoing $G_0$ mode can be achieved by an absence of losses associated with a series switch (such as $S_2$ in the second amplification path 104) and a series attenuator (such as the attenuator 114 in the second amplification path 104). In such a configuration, linearity may not be ideal; however, an optimum or desired combination of gain and noise figure can be achieved.

In some embodiments, the foregoing first gain mode ($G_0$ mode) can be a high gain mode; and such a gain mode can be utilized, for example, when the received signal is relatively weak. As described herein, the second amplification path 104 can be configured (e.g., with a low parasitic switch $S_2$) so as to allow the first amplification path to achieve such a high gain for the weak signal.

In some embodiments, the LNA 100 of FIG. 3 can be configured to operate in a second gain mode ($G_2$ mode) through the second amplification path 104. Such a mode can be utilized, for example, when the received signal is relatively strong. As shown in the example of FIG. 3, the adjustable attenuator 114 in the second amplification path 104 can be implemented in front of the second input transistor $M_2$ to facilitate a lower gain for the relatively strong signal. Accordingly, a desirable very high linearity performance can be achieved. Noise figure may be relatively high in such a configuration; but such a high noise figure can be acceptable for the strong signal and the low gain mode.

FIG. 3 shows that in some embodiments, the first input transistor $M_1$ and the second input transistor $M_2$ can share a common degeneration inductance $L_S$. Such sharing of the common degeneration inductance can be appropriate, for example, when the two input transistors ($M_1$ and $M_2$) are similar or substantially the same. As described herein, in some embodiments, each of the first input transistor $M_1$ and the second input transistor $M_2$ can have its own degeneration inductance.

Figure 4A:
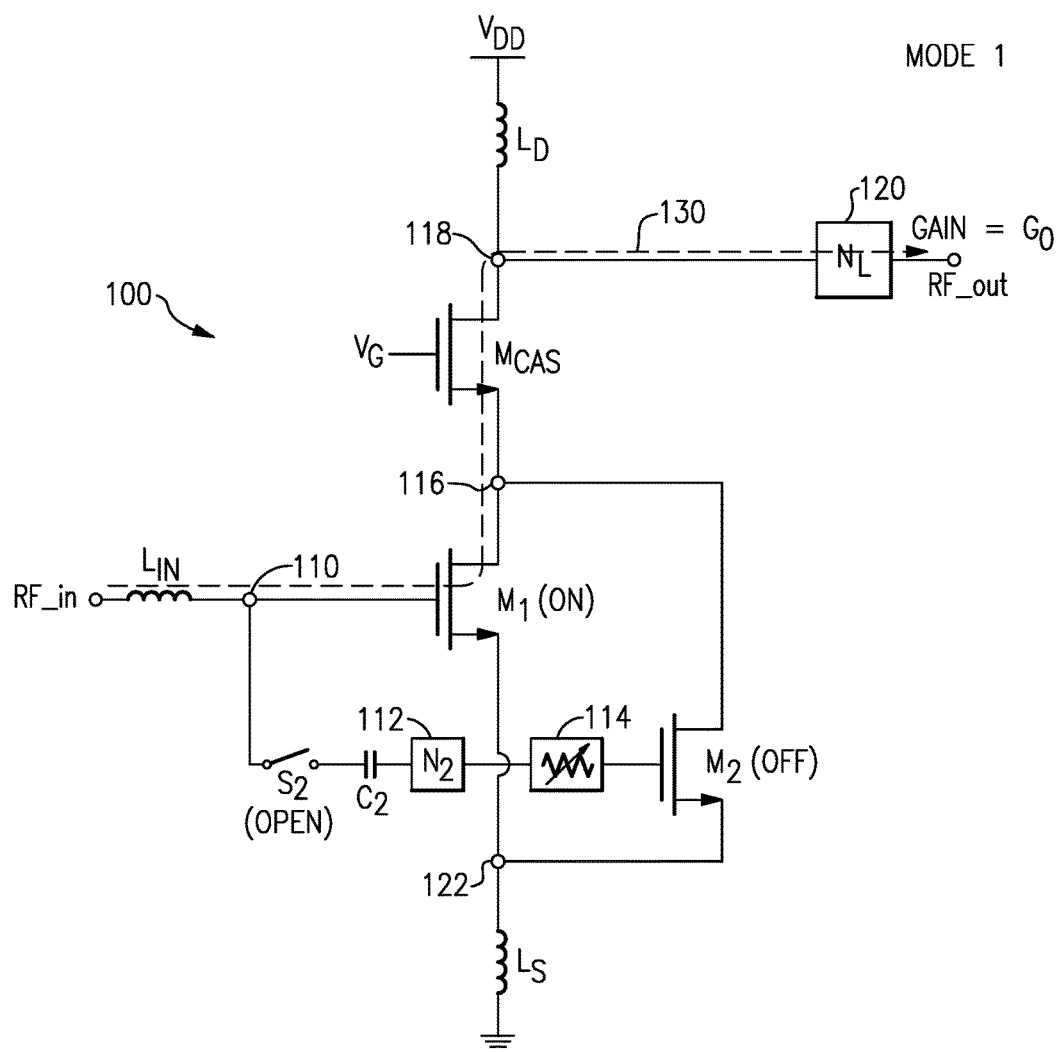
FIG. 4A shows the LNA of FIG. 3 being operated in a first gain mode ($G_0$ mode) to provide a high gain.
Figure 4B:
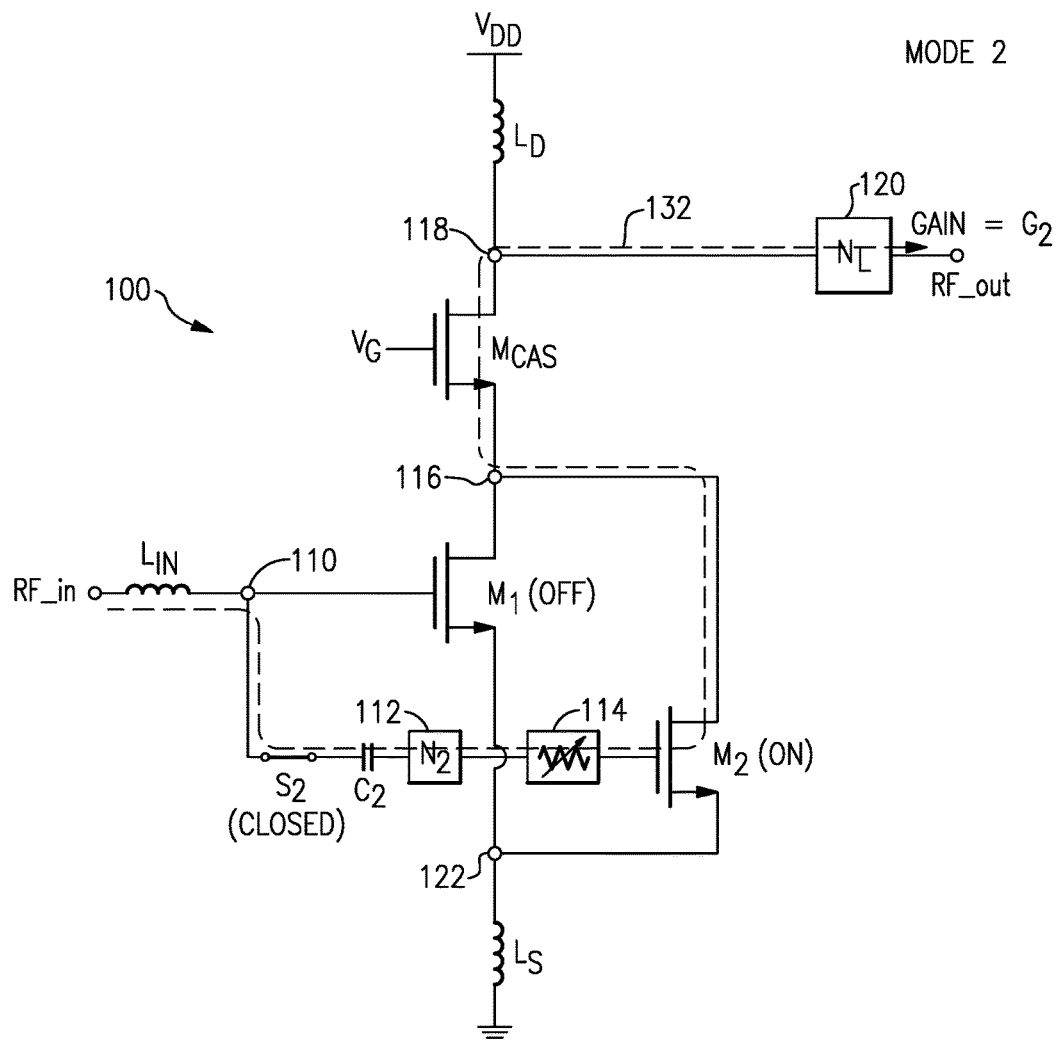
FIG. 4B shows the LNA of FIG. 3 being operated in a second gain mode ($G_2$ mode) to provide a low gain.

FIG. 4A shows the LNA 100 of FIG. 3 being operated in the first gain mode ($G_0$ mode) to provide a high gain. FIG. 4B shows the LNA 100 of FIG. 3 being operated in the second gain mode ($G_2$ mode) to provide a low gain. Such gain modes can be achieved by operating the first input transistor $M_1$, the second input transistor $M_2$, and the switch $S_2$ as listed in Table 1.

TABLE 1

| Gain mode | Gain achieved | M1 state | M2 state | S2 state |
|---|---|---|---|---|
| G0 | High | ON | OFF | OFF |
| G2 | Low | OFF | ON | ON |

In FIG. 4A, the first gain mode ($G_0$ mode) is shown to result in a signal being routed and amplified as indicated by a path 130. In FIG. 4B, the second gain mode ($G_2$ mode) is shown to result in a signal being routed and amplified as indicated by a path 132.

In the example of FIG. 3, the first input transistor $M_1$ and the second input transistor $M_2$ are shown to share a common input node 110. In some embodiments, such an input node can be implemented as, or be electrically connected to, a single input pad on a die (e.g., a silicon-on-insulator (SOI) die) on which the LNA 100 is implemented.

Figure 5:
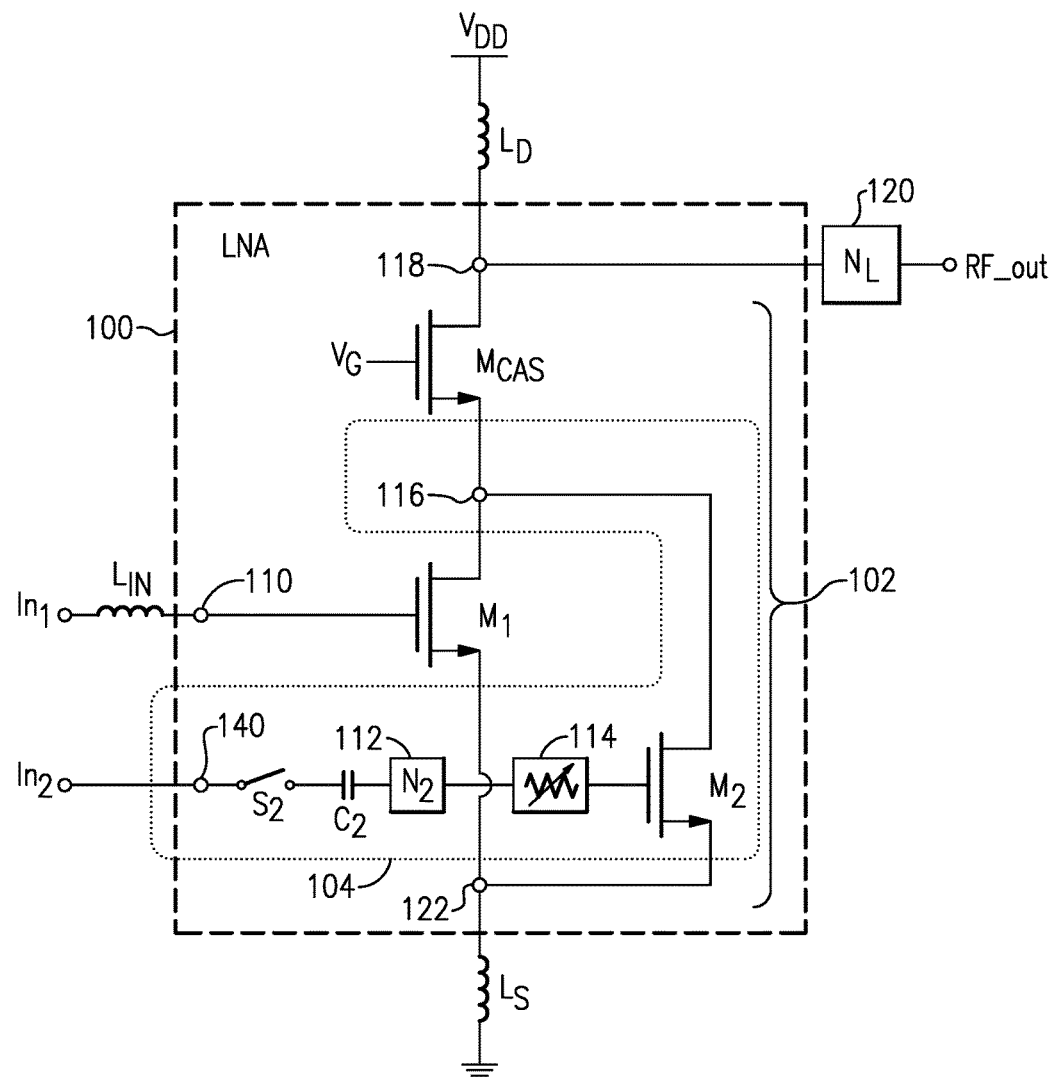
FIG. 5 shows that in some embodiments, a first input transistor and a second input transistor of an LNA do not necessarily need to share a common input.

FIG. 5 shows that in some embodiments, the first input transistor $M_1$ and the second input transistor $M_2$ do not necessarily need to share a common input pad. For example, a signal to be processed by the LNA 100 of FIG. 5 may be routed appropriately before reaching the LNA. Thus, a first input node ($In_1$) can be provided to receive a signal to be processed by the first amplification path involving the first input transistor $M_1$. Similarly, a second input node ($In_2$) can be provided to receive a signal to be processed by the second amplification path involving the second input transistor $M_2$. In the example of FIG. 5, the first and second amplification paths are generally the same as those of the example of FIG. 3.

In the example of FIG. 5, the LNA 100 is depicted as including a node 110 after the input inductance $L_{IN}$, and a node 140 before the switch $S_2$. Assuming that such an LNA is implemented on a die such as an SOI die, the die may or may not include the input inductance $L_{IN}$. Assuming that the input inductance $L_{IN}$ is external to the LNA die, the nodes 110 and 140 associated with the first and second amplification paths can be implemented as or be electrically connected to two separate input pads on the die.

Figure 6A:
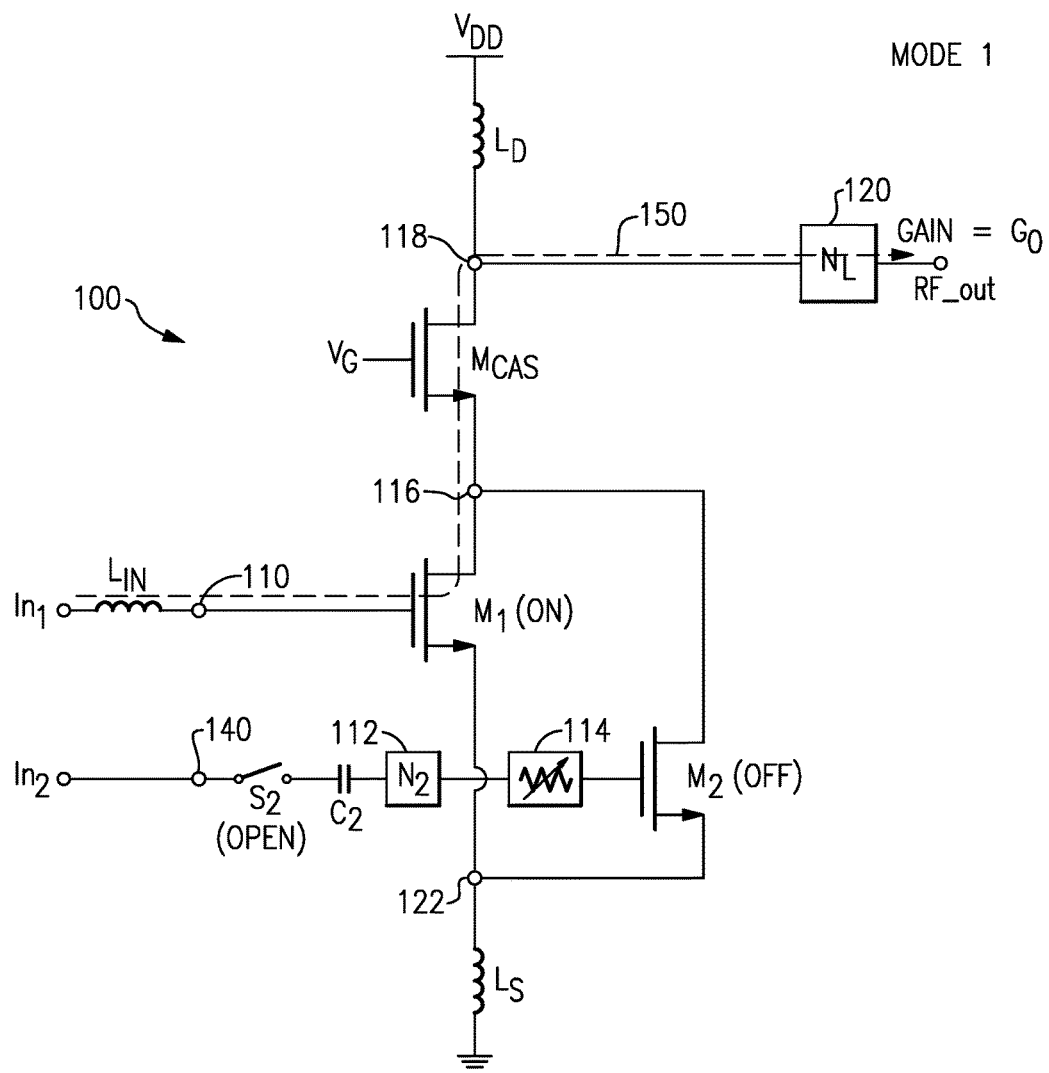
FIG. 6A shows the LNA of FIG. 5 being operated in a first gain mode ($G_0$ mode) to provide a high gain.
Figure 6B:
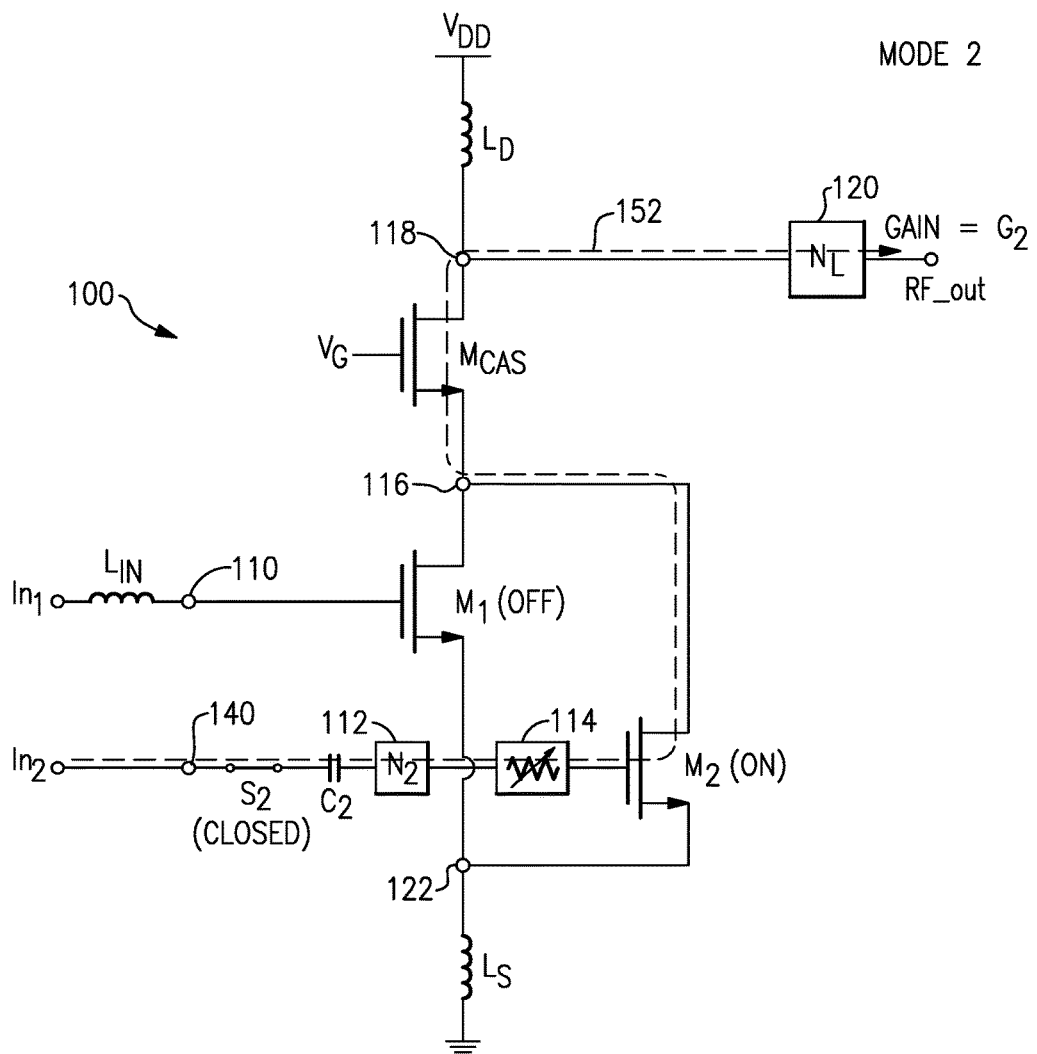
FIG. 6B shows the LNA of FIG. 5 being operated in a second gain mode ($G_2$ mode) to provide a low gain.

FIG. 6A shows the LNA 100 of FIG. 5 being operated in the first gain mode ($G_0$ mode) to provide a high gain. FIG. 6B shows the LNA 100 of FIG. 5 being operated in the second gain mode ($G_2$ mode) to provide a low gain. Such gain modes can be achieved by operating the first input transistor $M_1$, the second input transistor $M_2$, and the switch $S_2$ as listed in Table 1.

In FIG. 6A, the first gain mode ($G_0$ mode) is shown to result in a signal being routed and amplified as indicated by a path 150. In FIG. 6B, the second gain mode ($G_2$ mode) is shown to result in a signal being routed and amplified as indicated by a path 152.

Figure 7:
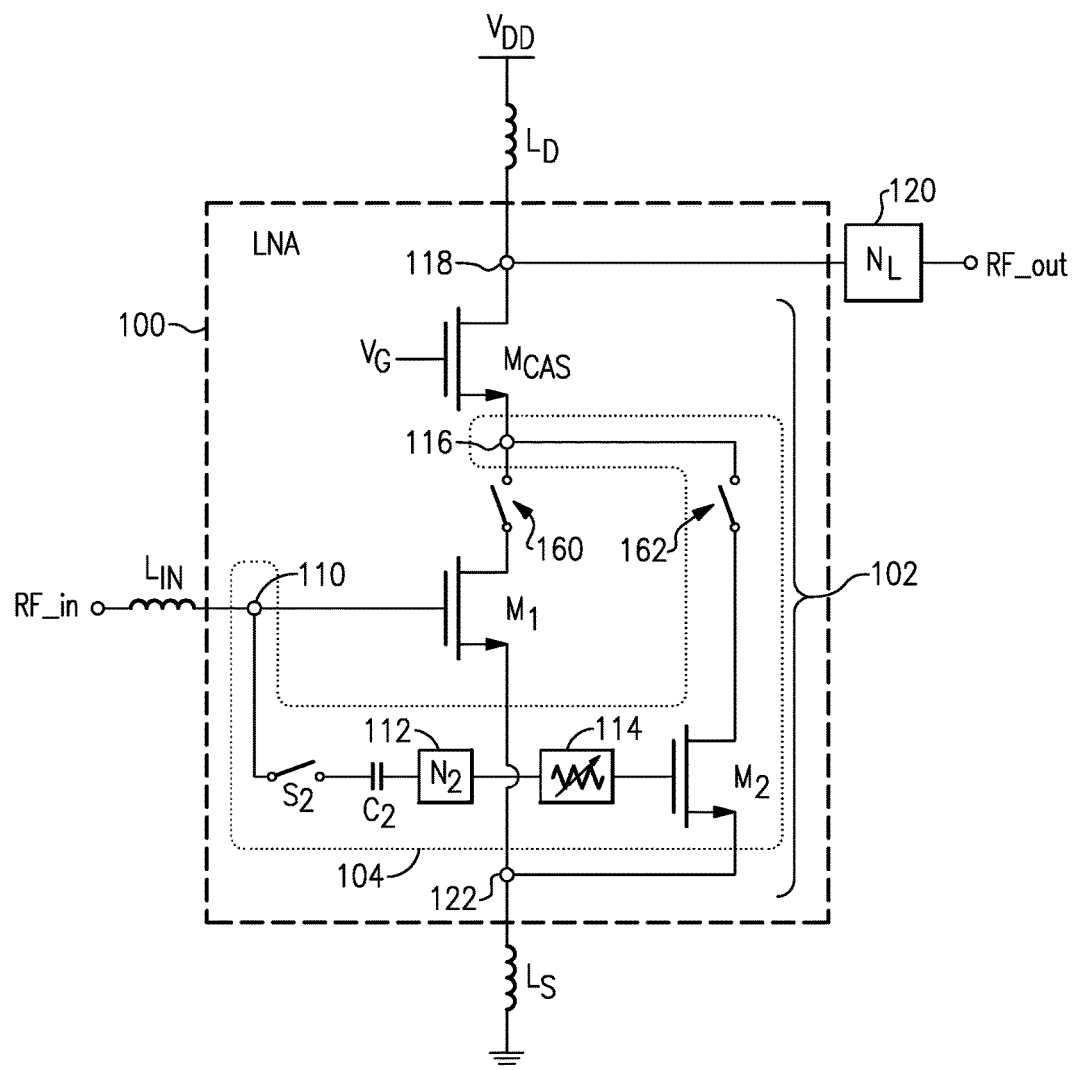
FIG. 7 shows that in some embodiments, an LNA having one or more features as described herein can include a switch between an input transistor and a cascode transistor for each of the first and second amplification paths.

FIG. 7 shows that in some embodiments, an LNA 100 having one or more features as described herein can include a switch between the input transistor ($M_1$ or $M_2$) and the cascode transistor ($M_{CAS}$) for each of the first and second amplification paths. Other than such switches, the example LNA 100 of FIG. 7 can be similar to the example of FIG. 3.

In the example of FIG. 7, a switch 160 is shown to be implemented between the first input transistor $M_1$ and the cascode transistor $M_{CAS}$. Similarly, a switch 162 is shown to be implemented between the second input transistor $M_2$ and the cascode transistor $M_{CAS}$. In some embodiments, each of such switches 160, 162 can be implemented when some levels of isolation and/or return loss are desired.

Figure 8A:
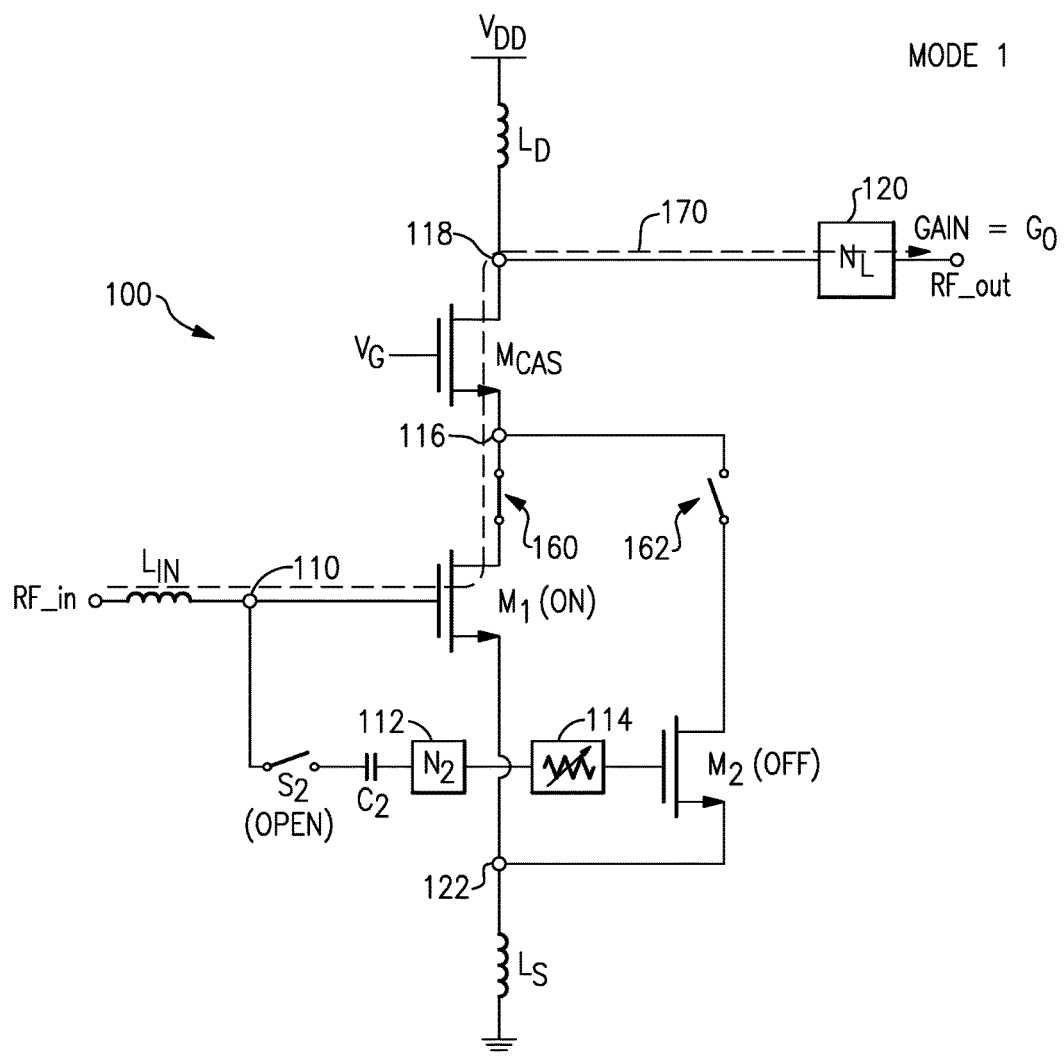
FIG. 8A shows the LNA of FIG. 7 being operated in a first gain mode ($G_0$ mode) to provide a high gain.
Figure 8B:
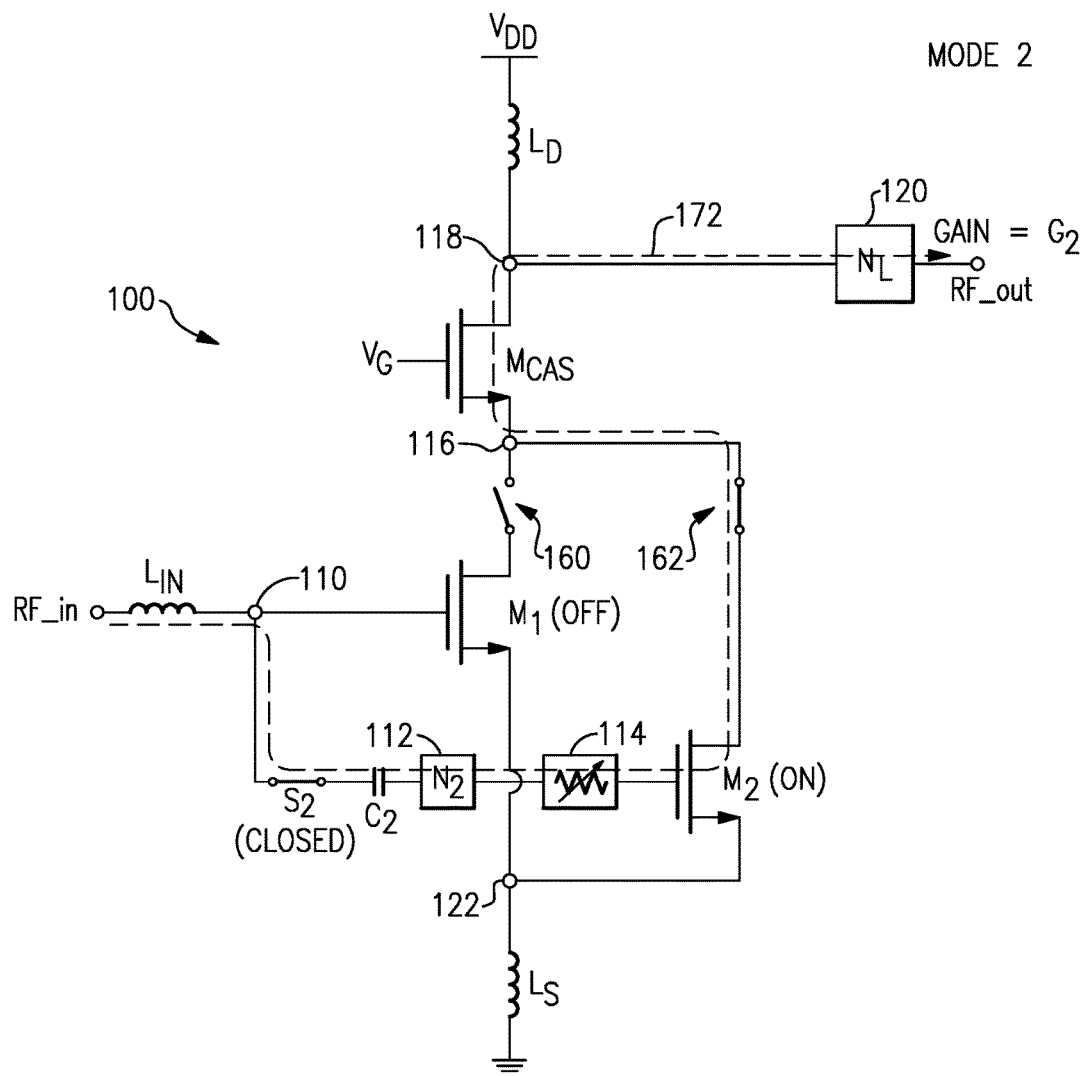
FIG. 8B shows the LNA of FIG. 7 being operated in a second gain mode ($G_2$ mode) to provide a low gain.

FIG. 8A shows the LNA 100 of FIG. 7 being operated in the first gain mode ($G_0$ mode) to provide a high gain. FIG. 8B shows the LNA 100 of FIG. 7 being operated in the second gain mode ($G_2$ mode) to provide a low gain. Such gain modes can be achieved by operating the first input transistor $M_1$, the second input transistor $M_2$, the switch $S_2$, and the switches 160, 162 as listed in Table 2.

TABLE 2

| Gain mode | Gain achieved | M1 state | M2 state | S2 state | Switch 160 state | Switch 162 state |
|---|---|---|---|---|---|---|
| G0 | High | ON | OFF | OFF | ON | OFF |
| G2 | Low | OFF | ON | ON | OFF | ON |

In FIG. 8A, the first gain mode ($G_0$ mode) is shown to result in a signal being routed and amplified as indicated by a path 170. In FIG. 8B, the second gain mode ($G_2$ mode) is shown to result in a signal being routed and amplified as indicated by a path 172.

Figure 9:
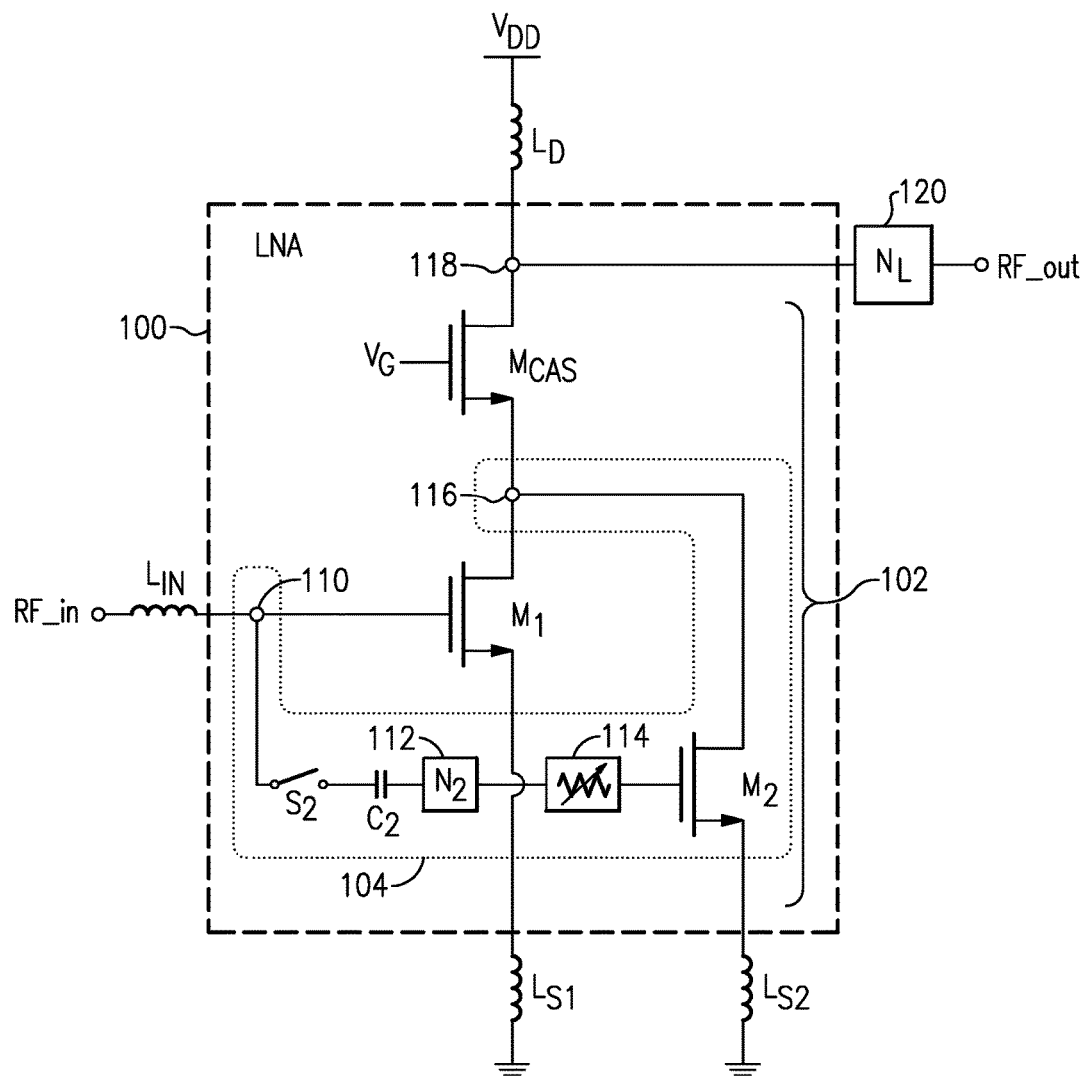
FIG. 9 shows an example LNA in which each of first and second input transistors has its own degeneration inductance to ground.

As described in reference to FIGS. 3 and 5, the first and second input transistors ($M_1$ and $M_2$) may or may not share a common degeneration inductance to ground. FIG. 9 shows an example LNA 100 in which each of the first and second input transistors ($M_1$ and $M_2$) has its own degeneration inductance coupling to ground. For example, the first input transistor $M_1$ is shown to have its source coupled to ground through a first degeneration inductance $L_{S1}$. Similarly, the second input transistor $M_2$ is shown to have its source coupled to ground through a second degeneration inductance $L_{S2}$. In some embodiments, the first and second input transistors ($M_1$ and $M_2$) can be different from each other, and their respective degeneration inductances can be configured accordingly.

In the example of FIG. 9, operation of the LNA 100 to achieve first and second gain modes can be achieved similar to the examples of FIGS. 3, 4A and 4B.

In the various examples described herein, LNAs are shown to have amplifying transistors and switches implemented as field-effect transistors (FETs). It will be understood that one or more features of the present disclosure can also be implemented utilizing other types of transistors. For example, amplifying transistors and switches can be implemented as bipolar-junction transistors (BJTs), FETs, or any combination thereof.

In some embodiments, an LNA having one or more features as described herein can utilize a second amplification path (also referred to herein as an active gain bypass circuit) to achieve a second gain mode operation, also as described herein. Such a second gain mode of operation can provide, for example, a second gain ($G_2$) having a third-order input intercept point (IIP3) that is greater than 10 dBm, with minimal or reduced impact to an optimal gain and noise figure combination of a first (e.g., primary) gain mode ($G_0$).

In some embodiments, and as described herein, the foregoing active gain bypass circuit can be implemented to allow the LNA to maintain a substantially same phase in both of the first and second gain modes. Such same-phase feature is typically important for, for example, receiver error vector magnitude (EVM) performance.

Figure 10:
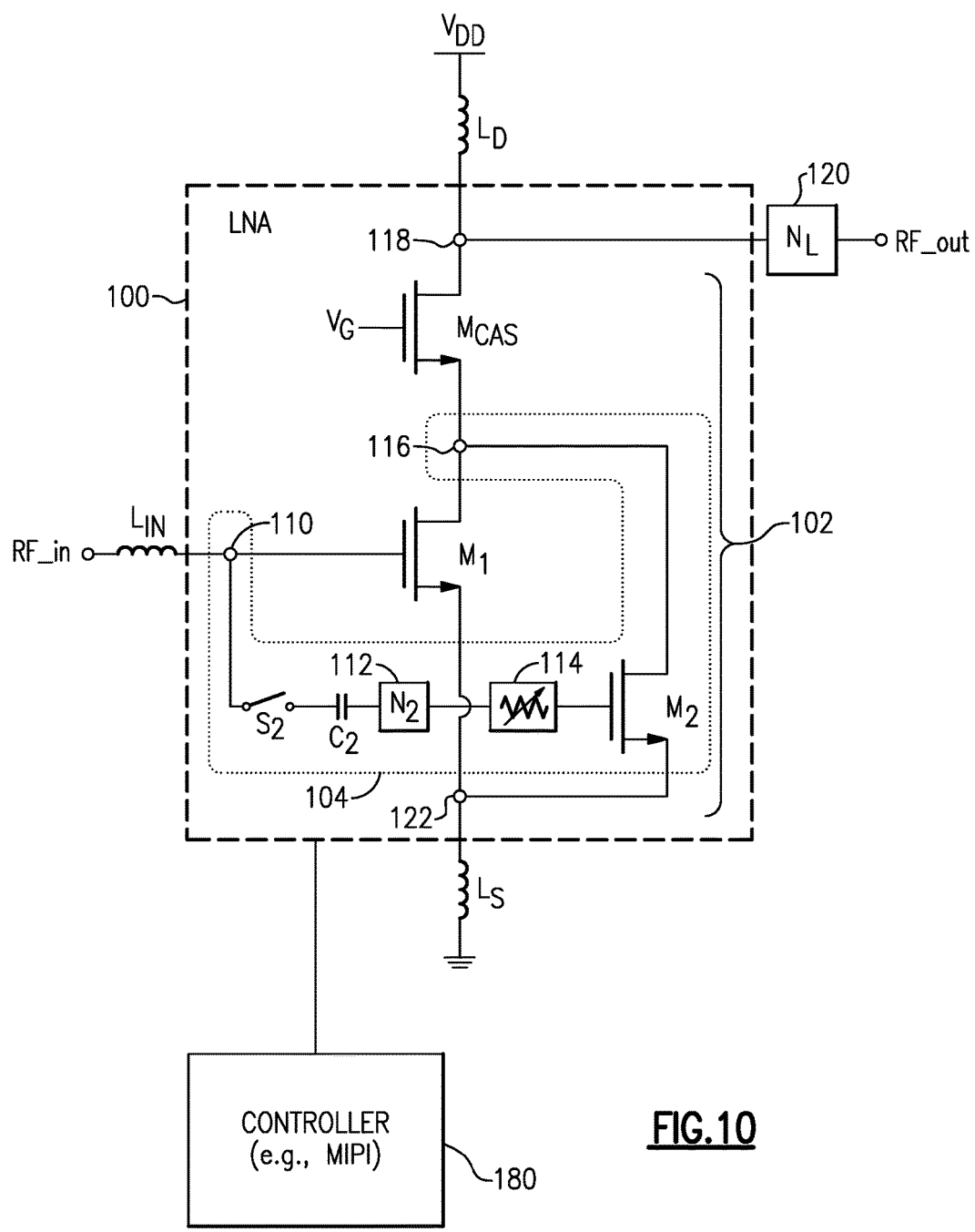
FIG. 10 shows that in some embodiments, an LNA having one or more features as described herein can be controlled by a controller.

FIG. 10 shows that in some embodiments, an LNA 100 and an active gain bypass circuit 104 having one or more features as described herein can be controlled by a controller 180. Such a controller can provide various control signals to, for example, operate the various amplification transistors and switches (e.g., switch transistors) to achieve various gain modes. In some embodiments, the controller 180 can be configured to include MIPI (Mobile Industry Processor Interface) functionality.

Figure 11:
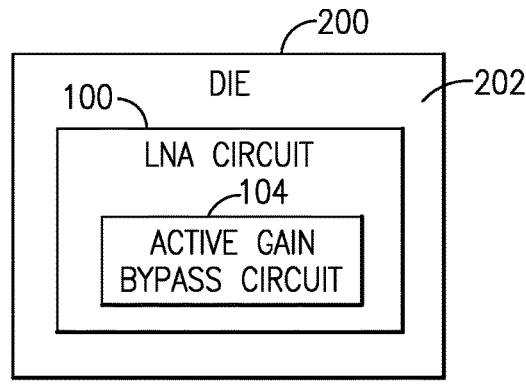
FIG. 11 shows that in some embodiments, some or all of an LNA having one or more features as described herein can be implemented on a semiconductor die.

FIG. 11 shows that in some embodiments, some or all of an LNA 100 having one or more features as described herein can be implemented on a semiconductor die 200. Such a die can include a substrate 202, and at least some of an active gain bypass circuit 104 can be implemented on the substrate 202.

In some embodiments, the semiconductor die 100 of FIG. 11 can be a silicon-on-die (SOI) die, and at least the first and second input transistors ($M_1$ and $M_2$), the cascode transistor ($M_{CAS}$), and the switch $S_2$ of the second amplification path of the LNA 100 can be implemented on such an SOI die. Such transistors can be implemented as, for example, 0.13 µm CMOS devices.

Figure 12:
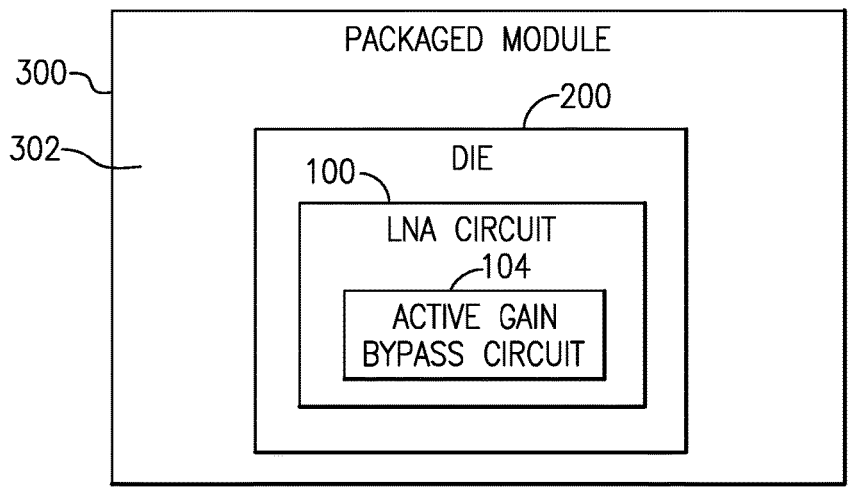
FIG. 12 shows an example where some or all of an LNA having one or more features as described herein can be implemented on a packaged module.
Figure 13:
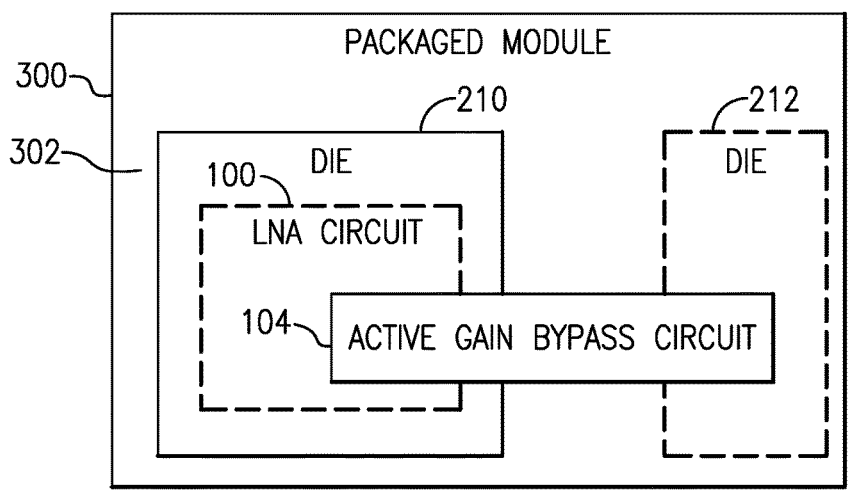
FIG. 13 shows another example where some or all of an LNA having one or more features as described herein can be implemented on a packaged module.

FIGS. 12 and 13 show that in some embodiments, some or all of an LNA 100 having one or more features as described herein can be implemented on a packaged module 300. Such a module can include a packaging substrate 302 configured to receive a plurality of components such as one or more die and one or more passive components.

FIG. 12 shows that in some embodiments, the packaged module 300 can include a semiconductor die 200 that is similar to the example of FIG. 11. Accordingly, such a die can include some or all of the LNA 100, with at least some of an active gain bypass circuit 104 being implemented on the die 200.

FIG. 13 shows that in some embodiments, the packaged module 300 can include a first semiconductor die 210 having an LNA 100 implemented thereon. In the example of FIG. 13, some of an active gain bypass circuit 104 can be implemented on the first die 210, and the rest of the active gain bypass circuit 104 can be implemented on another die 212, outside of a die (e.g., on the packaging substrate 302), or any combination thereof.

Figure 14:
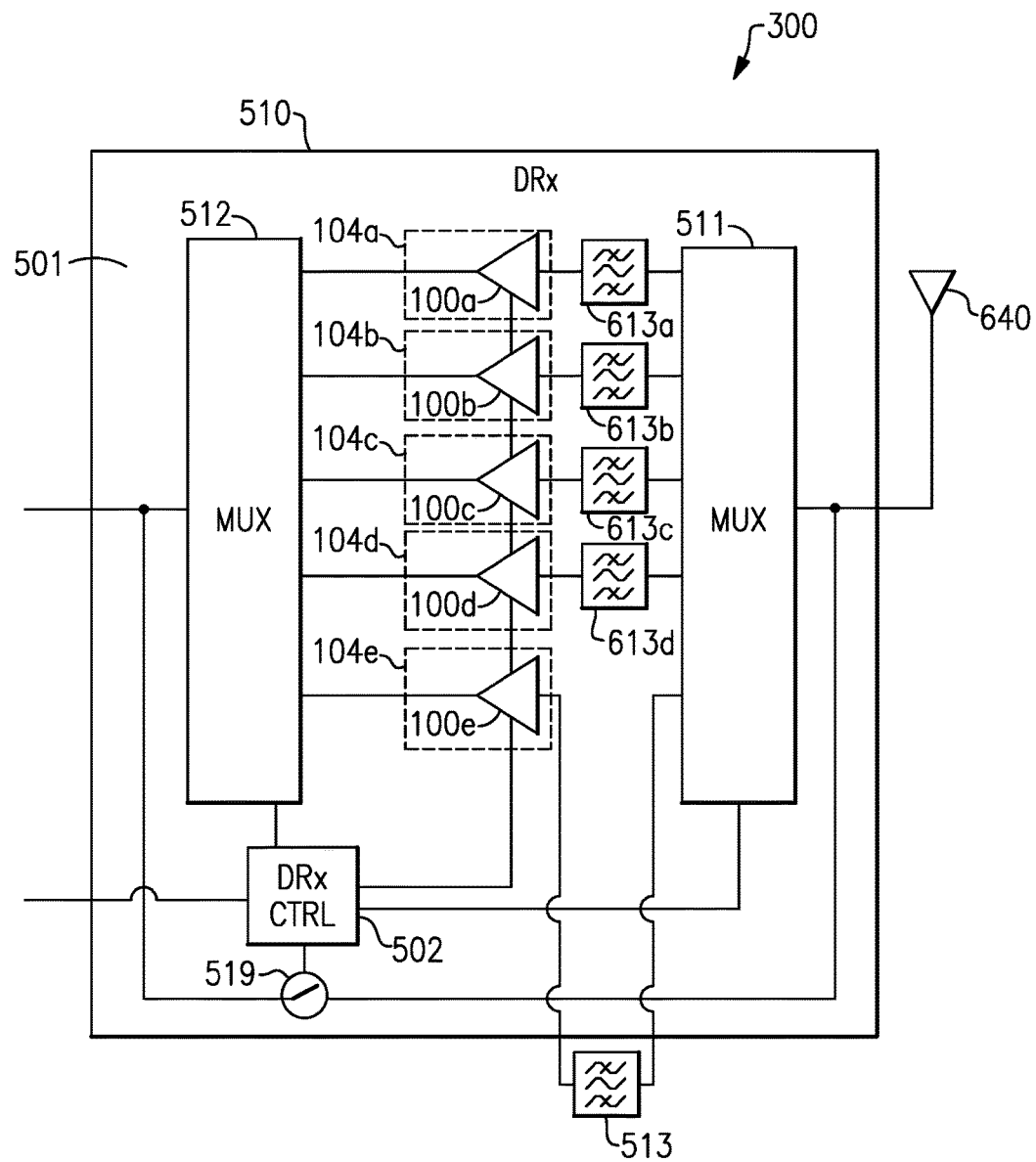
FIG. 14 shows that in some embodiments, the packaged module of FIG. 12 or 13 can be a diversity receiver module.

FIG. 14 shows that in some embodiments, a diversity receiver module 300 can be an example of the modules 300 of FIGS. 12 and 13. In some embodiments, such a DRx module can be coupled to an off-module filter 513. The DRx module 300 can include a packaging substrate 501 configured to receive a plurality of components and a receiving system implemented on the packaging substrate 501. The DRx module 300 can include one or more signal paths that are routed off the DRx module 300 and made available to a system integrator, designer, or manufacturer to support a filter for any desired band.

The DRx module 300 includes a number of paths between the input and the output of the DRx module 300. The DRx module 300 includes a bypass path between the input and the output activated by a bypass switch 519 controlled by the DRx controller 502. Although FIG. 14 depicts a single bypass switch 519, in some implementations, the bypass switch 519 may include multiple switches (e.g., a first switch disposed physically close to the input and a second switch disposed physically close to the output. As shown in FIG. 14, the bypass path does not include a filter or an amplifier.

The DRx module 300 includes a number of multiplexer paths including a first multiplexer 511 and a second multiplexer 512. The multiplexer paths include a number of on-module paths that include the first multiplexer 511, a bandpass filter 613a-613d implemented on the packaging substrate 501, an amplifier 100a-100d implemented on the packaging substrate 501, and the second multiplexer 512. The multiplexer paths include one or more off-module paths that include the first multiplexer 511, a bandpass filter 513 implemented off the packaging substrate 501, an amplifier 100e, and the second multiplexer 512. The amplifier 514 may be a wide-band amplifier implemented on the packaging substrate 501 or may also be implemented off the packaging substrate 501. In some embodiments, the amplifiers 100a-100d, 100e may be variable-gain amplifiers and/or variable-current amplifiers.

A DRx controller 502 is configured to selectively activate one or more of the plurality of paths between the input and the output. In some implementations, the DRx controller 502 is configured to selectively activate one or more of the plurality of paths based on a band select signal received by the DRx controller 502 (e.g., from a communications controller). The DRx controller 502 may selectively activate the paths by, for example, opening or closing the bypass switch 519, enabling or disabling the amplifiers 100a-100d, 100e, controlling the multiplexers 511, 512, or through other mechanisms. For example, the DRx controller 502 may open or close switches along the paths (e.g., between the filters 613a-613d, 513 and the amplifiers 100a-100d, 100e) or by setting the gain of the amplifiers 100a-100d, 100e to substantially zero.

In the example DRx module 300 of FIG. 14, some or all of the amplifiers 100a-100d, 100e can be provided with active gain bypass circuit 104 having one or more features as described herein. For example, each of such amplifiers (100) is shown to have associated with it an active gain bypass circuit 104.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 15:
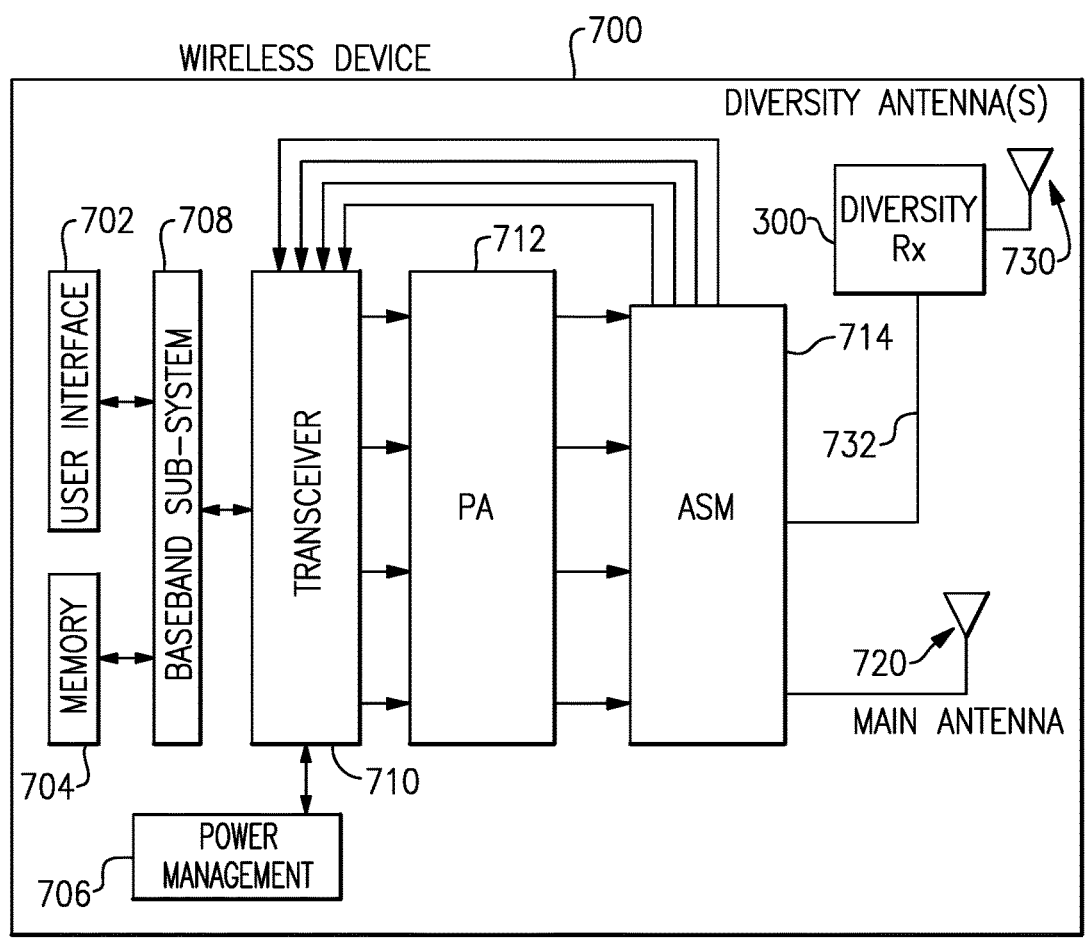
FIG. 15 depicts an example wireless device having one or more advantageous features described herein.

FIG. 15 depicts an example wireless device 700 having one or more advantageous features described herein. In some embodiments, an LNA having one or more features as described herein can be implemented in each of one or more places in such a wireless device. For example, in some embodiments, such advantageous features can be implemented in a module such as a diversity receive (DRx) module 300 having one or more low-noise amplifiers (LNAs).

In the example of FIG. 15, power amplifiers (PAs) in a PA module 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 504 that is configured to store data and/or instructions to facilitate the operation of the wireless device, and/or to provide storage of information for the user.

In the example of FIG. 15, the DRx module 300 can be implemented between one or more diversity antennas (e.g., diversity antenna 730) and the ASM 714. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 300 can then be routed to the ASM through one or more signal paths.

In the example of FIG. 15, a main antenna 720 can be configured to, for example, facilitate transmission of RF signals from the PA module 512. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency amplifier comprising:
a first amplification path implemented to amplify a signal, and including a cascode arrangement of a first input transistor and a cascode transistor to provide a first gain for the signal when in a first mode;

a second amplification path implemented to provide a second gain for the signal when in a second mode, the second amplification path including a cascode arrangement of a second input transistor and the cascode transistor shared with the first amplification path;

a switch configured to allow routing of the signal through the first amplification path in the first mode or the second amplification path in the second mode; and an inter-stage switch implemented between the respective input transistor and the cascode transistor of each of the first and second amplification paths.

2. The radio-frequency amplifier of claim 1 wherein the first gain is greater than the second gain.

3. The radio-frequency amplifier of claim 2 wherein the switch is implemented to be a part of the second amplification path.

4. The radio-frequency amplifier of claim 3 wherein the second amplification path further includes an attenuator in series with the switch, and configured to facilitate the second gain of the second mode.

5. The radio-frequency amplifier of claim 3 wherein the second amplification path further includes a matching network in series with the switch.

6. The radio-frequency amplifier of claim 3 wherein the first amplification path and the second amplification path share a common input node.

7. The radio-frequency amplifier of claim 3 wherein the first amplification path and the second amplification path have separate input nodes.

8. The radio-frequency amplifier of claim 3 wherein each of the first input transistor, the second input transistor, and the cascode transistor is implemented as a field-effect transistor having a gate, a source, and a drain.

9. The radio-frequency amplifier of claim 8 wherein each of the first input transistor, the second input transistor, the cascode transistor, and the switch of the second amplification path is implemented as a silicon-on-insulator device.

10. The radio-frequency amplifier of claim 8 wherein the gate of each of the first input transistor and the second input transistor is configured to receive the signal, the drain of each of the first input transistor and the second input transistor is coupled to the source of the cascode transistor, and the source of each of the first input transistor and the second input transistor is inductively coupled to ground.

11. The radio-frequency amplifier of claim 10 wherein the drain of the cascode transistor is coupled to an output node of the radio-frequency amplifier and configured to receive a supply voltage.

12. The radio-frequency amplifier of claim 10 wherein the source of the first input transistor and the source of the second input transistor are inductively coupled to ground through a common degeneration inductance.

13. The radio-frequency amplifier of claim 10 wherein the source of the first input transistor and the source of the second input transistor are inductively coupled to ground through separate degeneration inductances.

14. The radio-frequency amplifier of claim 3 wherein the radio-frequency amplifier is a low-noise amplifier.

15. The radio-frequency amplifier of claim 14 wherein the switch of the second amplification path is configured to provide a reduced level of parasitic capacitance when in an OFF state in the first mode.

16. The radio-frequency amplifier of claim 15 wherein the first amplification path is configured to provide the first gain for a weak received signal, such that the amplified signal includes a desired combination of the first gain and a low noise figure.

17. The radio-frequency amplifier of claim 15 wherein the second amplification path is configured to provide the second gain for a strong received signal, such that the amplified signal includes a desired combination of the second gain and a high linearity level.

18. A semiconductor die having a radio-frequency circuit, comprising:

a substrate; and an amplifier implemented on the substrate, the amplifier including a first amplification path implemented to amplify a signal and having a cascode arrangement of a first input transistor and a cascode transistor to provide a first gain for the signal when in a first mode, the amplifier further including a second amplification path implemented to provide a second gain for the signal when in a second mode, the second amplification path including a cascode arrangement of a second input transistor and the cascode transistor shared with the first amplification path, the amplifier further including a switch configured to allow routing of the signal through the first amplification path in the first mode or the second amplification path in the second mode, the amplifier further including an inter-stage switch implemented between the respective input transistor and the cascode transistor of each of the first and second amplification paths.

19. A radio-frequency module comprising:

a packaging substrate configured to receive a plurality of components; and an amplifier implemented on the packaging substrate, the amplifier including a first amplification path implemented to amplify a signal and having a cascode arrangement of a first input transistor and a cascode transistor to provide a first gain for the signal when in a first mode, the amplifier further including a second amplification path implemented to provide a second gain for the signal when in a second mode, the second amplification path including a cascode arrangement of a second input transistor and the cascode transistor shared with the first amplification path, the amplifier further including a switch configured to allow routing of the signal through the first amplification path in the first mode or the second amplification path in the second mode, the amplifier further including an inter-stage switch implemented between the respective input transistor and the cascode transistor of each of the first and second amplification paths.

* * * * *